United States Patent [19]

Shekhawat et al.

[11] Patent Number: 4,937,468

[45] Date of Patent: Jun. 26, 1990

[54] ISOLATION CIRCUIT FOR PULSE WAVEFORMS

[75] Inventors: Sampat S. Shekhawat; P. John Dhyanchand, both of Rockford, Ill.

[73] Assignee: Sundstrand Corporation, Rockford, Ill.

[21] Appl. No.: 294,658

[22] Filed: Jan. 9, 1989

[51] Int. Cl.$^5$ .................. H03K 5/01; H03K 3/284; H03K 3/01; H02M 3/335

[52] U.S. Cl. .................. 307/268; 307/270; 307/273; 328/60; 328/61; 328/164; 363/25; 363/26

[58] Field of Search ............ 307/262, 268, 270, 254, 307/273, 571, 265; 363/25, 26; 328/164

[56] References Cited

U.S. PATENT DOCUMENTS

| | | | |
|---|---|---|---|
| 3,942,042 | 3/1976 | Nikami | 307/268 |
| 4,021,685 | 5/1977 | Goodall et al. | 307/268 |
| 4,466,052 | 8/1984 | Thrap | 363/41 |
| 4,495,554 | 1/1985 | Simi et al. | 363/97 |
| 4,565,931 | 1/1986 | Fumey | 307/268 |
| 4,683,528 | 7/1987 | Snow et al. | 363/97 |
| 4,694,206 | 9/1987 | Weinberg | 307/571 |
| 4,710,645 | 12/1987 | Doittau et al. | 307/571 |
| 4,716,513 | 12/1987 | Ito | 363/97 |

FOREIGN PATENT DOCUMENTS 2123225  1/1984  United Kingdom ............... 307/265

Primary Examiner—Stanley D. Miller
Assistant Examiner—Trong Phan
Attorney, Agent, or Firm—Wood, Phillips, Mason, Recktenwald & VanSanten

[57] ABSTRACT

A load is controlled by a pulse waveform from a source. The source and load are electrically isolated by using two monostable circuits to detect the leading and trailing edge of the pulse waveform, two pulse transformers to isolate the source and the load, and a bistable circuit to reconstruct the original pulse waveform.

6 Claims, 2 Drawing Sheets

FIG. 1
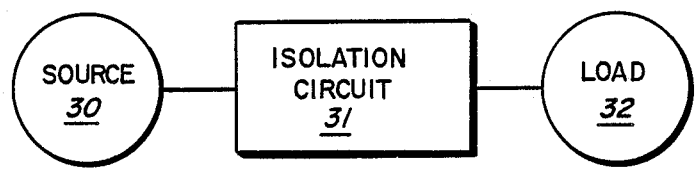
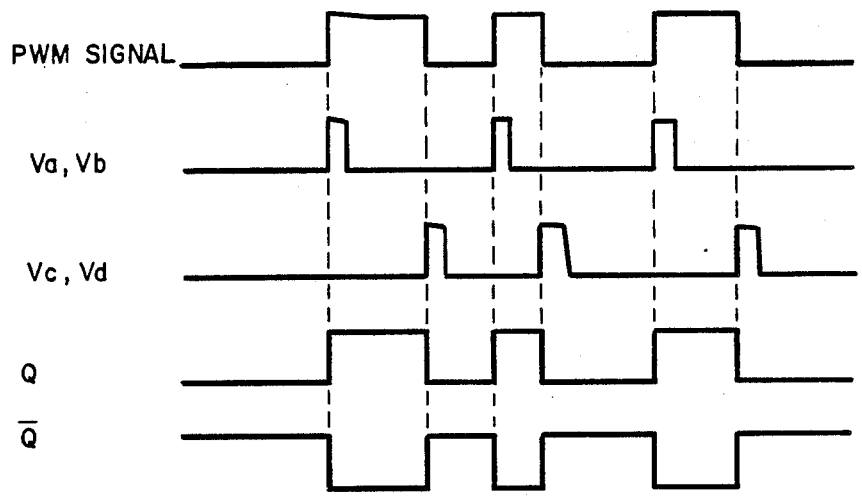
FIG. 3

ISOLATION CIRCUIT FOR PULSE WAVEFORMS

FIELD OF THE INVENTION

This invention relates to an isolation circuit where a pulse waveform must be accurately reproduced while isolating the source of the waveform from the load. More specifically, the circuit relates to a base drive for a transistor switch where the transistor must be isolated from the pulse waveform source.

BACKGROUND OF THE INVENTION

An inverter converts DC power to AC loads. One type of inverter is a pulse-width modulated (PWM) inverter. The PWM inverter approximates sine-wave outputs by switching the power elements at a rate higher than the fundamental frequency. The timing of the switching is controlled by a PWM signal.

Generally, the PWM signal is generated in a closed-loop control system where the output of the inverter is summed with a sinusoidal reference. The PWM signal is then used to control power transistors or switches to produce the AC output. In a closed-loop control system, electrical isolation of the power transistor from the PWM signal generator is highly desirable.

Isolation can be attained by the use of optical couplers. Tharp, U.S. Pat. No. 4,466,052, and Ito, U.S. Pat. No. 4,716,513, illustrate DC to AC inverters using optical couplers for switch control pulses.

However, optical couplers are unreliable. They are affected by temperature changes such as may be encountered by high performance aircraft. They also have poor noise immunity.

Transformers can also be used to attain isolation. Generally, transformers perform better in environments with noise and temperature variations. However, the size and weight of transformers which can accurately reproduce the PWM signal without distortion is prohibitive.

For example, in an inverter which converts DC to 400 Hz AC, a pulse transformer to isolate the controlling PWM signal would need to be approximately four inches in diameter. Where size and weight are important criteria, for example, in high performance aircraft, use of such a transformer is not feasible.

This invention overcomes the problems associated with optical coupler and large pulse transformers by using logic circuitry and small pulse transformers. For the DC to AC 400 Hz inverter described above, this invention allows the use of pulse transformers with a diameter of one-fourth of an inch.

SUMMARY OF THE INVENTION

In accordance with this invention, an isolation circuit for pulse waveforms is provided. The source with an output of a pulse waveform is connected to each of two monostable circuits. One of the monostable circuits produces a pulse output on the leading edge of the pulse waveform while the other monostable circuit produces a pulse output on the trailing edge of the pulse waveform. The duration of the pulse outputs of the monostable circuits is much less than the original pulse waveform.

The output from the first monostable circuit is connected to the primary winding of the first of two pulse transformers. The output from the second monostable circuit is connected to the primary winding of the second pulse transformer. The secondary winding of the first transformer is connected to the "set" input of a bistable circuit while the secondary winding of the second transformer is similarly connected to the "reset" input of the bistable circuit.

The pulse produced from the first monostable circuit sets the bistable circuit, while the pulse produced from the second monostable circuit resets the bistable circuit. Thus, the load connected to the output of the bistable circuit receives the original source waveform.

Further features and advantages of the invention will readily be apparent from the following specification and from the drawings, in which:

FIG. 1 is a block diagram for the source, the isolation circuit, and the load;

FIG. 2 is a schematic diagram of a preferred embodiment of the isolation circuit; and FIG. 3 is a timing diagram for the isolation circuit.

BRIEF DESCRIPTION OF THE DRAWINGS

FIG. 1 illustrates the use of an isolation circuit. A source 30 provides a waveform to the isolation circuit 31. The circuit then accurately reproduces the waveform for use by the load 32 while maintaining the electrical isolation of the source 30 from the load 32. In an inverter, for example, the source 30 would generate a PWM timing signal, while the load 32 would be two switches controlling a DC power supply. Shekhawat et al., U.S. Pat. No. 4,635,177 discloses a circuit for generating such a PWM timing signal. An example of an inverter is Glennon, U.S. Pat. No. 4,559,593.

Figure 2:
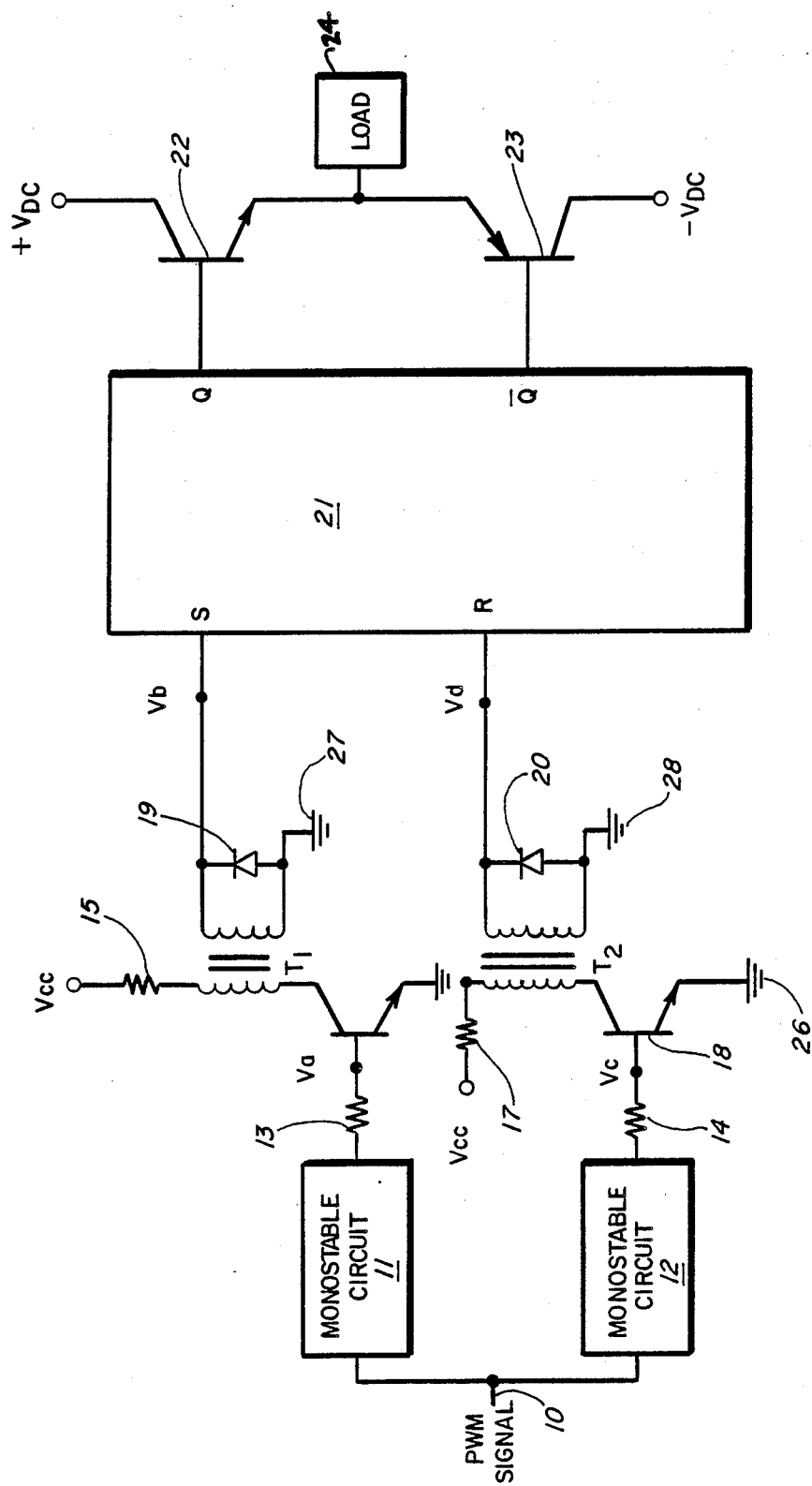
FIG. 2 is a diagram for an isolation circuit driving two transistor switches. The source provides a PWM signal to the isolation circuit.

The input terminal 10 is connected to monostable circuit 11 and monostable circuit 12. These could be integrated monostable circuits.

On the leading edge of the PWM signal, monostable circuit 11 produces a pulse as shown by Va, FIG. 3. Monostable circuit 12 produces a pulse as shown by Vc, FIG. 3, on the trailing edge of the PWM signal.

The output of monostable circuit 11 is connected through a series resistor 13 to the base of transistor 16. The collector of transistor 16 is attached to the primary winding of pulse transformer T1. The primary winding of pulse transformer T1 is coupled through a resistor 15 to DC voltage source Vcc. The emitter of transistor 16 is connected to ground 25.

Similarly, the output of monostable circuit 12 is coupled through a series resistor 14 to the base of transistor 18. The collector of the transistor is connected to the primary winding of pulse transformer T2, while the emitter of transistor 18 is connected to ground. The primary winding of pulse transformer T2 is coupled to DC voltage source Vcc through a resistor 17.

The output from monostable circuit 11, corresponding with the leading edge of the PWM signal as shown by Va in FIG. 3, forward biases the transistor 16 for the duration of the pulse, resulting in a pulse in the primary winding of pulse transformer T1. At the trailing edge of the PWM signal, a pulse from the monostable circuit 12, as shown by Vc in FIG. 3, forward biases transistor 18 for the duration of the pulse, resulting in a pulse in the primary winding of pulse transformer T2.

The secondary winding of pulse transformer T1 is coupled to the set input of bistable circuit 21, and to ground 27. A clipping diode 19 in parallel with the secondary winding of the transformer eliminates any unwanted voltage spikes.

The secondary winding of pulse transformer T2 is coupled to the reset input of bistable circuit 16, and to ground 28. A clipping diode 20 is in parallel with the secondary winding of the transformer.

The bistable circuit is preferably an RS flip-flop. A JK flip-flop could be used with additional timing circuitry.

On the leading edge of the PWM signal, the pulse in primary winding of pulse transformer T1 results in a pulse in the secondary winding of the pulse transformer T1, as shown by Vb, in FIG. 3. This pulse sets the bistable circuit 21, causing the Q output of the bistable to go high, while the $\overline{Q}$ output of the bistable circuit goes low, as shown by Q and $\overline{Q}$ in FIG. 3.

The trailing edge pulse from monostable circuit 12 is transmitted by the pulse transformer 18 to the reset input of bistable circuit 21, as shown by Vd, FIG. 3. This pulse causes the Q output of the bistable circuit 16 to go low, while the $\overline{Q}$ output of the bistable goes high, as shown by Q and $\overline{Q}$ in FIG. 3.

Thus, the Q output of bistable circuit 16 is an accurate reproduction of the original PWM signal received at the input connection, while the $\overline{Q}$ output of bistable circuit is the inverse of the original PWM signal.

The Q and $\overline{Q}$ outputs are coupled to switch transistors 22 and 23, supplying load 24 with AC power.

In aircraft electrical systems, a common frequency for AC power is 400 Hz. The pulse width for a PWM control signal used in an inverter would be in the order of 65 microseconds. Using a transformer to accurately reproduce this pulse without utilizing this invention would require a prohibitively large and heavy pulse transformer.

By using this invention, the size of the pulse transformer is substantially reduced. The pulse produced by the monostable circuits has a duration on the order of 2 microseconds. The substantial decrease in pulse duration allows the use of much smaller transformers. The diameter of a transformer to accurately reproduce such a signal is on the order of one fourth of an inch. The total weight of both transformers used in this invention is approximately one percent of the weight of the transformer needed without this invention.

The circuit maintains with high integrity the original PWM signal, but does so with small, lightweight pulse transformers. The unreliability of the optical coupler is avoided, making for safer, more efficient operation.

We claim:

1. An isolation circuit for coupling a pulse waveform having a leading edge and a trailing edge from a source to a load, comprising:
   first and second monostable circuits connected with said source, the first monostable circuit producing a pulse output in response to the leading edge of said waveform, and the second monostable circuit producing a pulse output in response to the trailing edge of said waveform;
   first and second pulse transformers, each with a primary and secondary winding, the primary winding of the one of two transformers being connected to the output of the first monostable circuit, and the primary winding of the other pulse transformer being connected to the output of the second monostable circuit;
   a bistable circuit which has a set input and a reset input, wherein the set input is connected to the secondary winding of one of two pulse transformers, and the reset input is connected to the secondary winding of the other pulse transformer, whereby the output of the bistable circuit reproduces the pulse waveform from said source, for coupling to said load.

2. The isolation circuit of claim 1 including transistors coupling each of the monostable circuits to the respective pulse transformer.

3. The isolation circuit of claim 1 wherein the bistable circuit is an RS flip-flop.

4. The isolation circuit of claim 1 in which the pulse outputs of the monostable circuits have a duration less than the duration of the pulse waveform.

5. An isolation circuit to be used in an inverter for coupling a pulse width modulated (PWM) control signal to two inverter power switches, comprising:
   first and second monostable circuits connected to the PWM control signal, the first monostable circuit producing a pulse output in response to the leading edge of the PWM signal, and the second monostable circuit producing a pulse output in response to the trailing edge of said PWM signal;
   first and second pulse transformers, each with a primary and secondary winding, the primary winding of the first pulse transformer being connected to the output of the first monostable circuit, and the primary winding of the second pulse transformer being connected to the output of the second monostable circuit;
   a bistable circuit which has a set input and a reset input, wherein the set input is connected to the secondary winding of one of two pulse transformers, and the reset input is connected to the secondary winding of the other pulse transformer, whereby the output of the bistable circuit reproduces the PWM signal to control one of said inverter switches and the inverse of the output of the bistable circuit controls the other inverter switch.

6. The isolation circuit of claim 5 in which the PWM control signal has a duration on the order of 65 microseconds, and the pulse outputs of the monostable circuits have a duration on the order of 2 microseconds.

* * * * *